United States Patent [19]

Tseng et al.

[11] Patent Number: 5,565,382
[45] Date of Patent: Oct. 15, 1996

[54] PROCESS FOR FORMING TUNGSTEN SILICIDE ON SEMICONDUCTOR WAFER USING DICHLOROSILANE GAS

[75] Inventors: Meng C. Tseng, Saratoga; Susan Telford; Mei Chang, both of Cupertino, all of Calif.

[73] Assignee: Applied Materials, Inc., Santa Clara, Calif.

[21] Appl. No.: 135,202

[22] Filed: Oct. 12, 1993

[51] Int. Cl.$^6$ .................................................. H01L 21/285
[52] U.S. Cl. .......................... 437/200; 437/245; 427/255.2; 118/728; 118/715
[58] Field of Search ...................................... 437/200, 245; 427/255.2, 126.1; 118/728, 715

[56] References Cited

U.S. PATENT DOCUMENTS

| | | | |
|---|---|---|---|
| 4,956,204 | 9/1990 | Amazawa et al. | 427/248.1 |
| 5,075,256 | 12/1991 | Wang et al. | 437/225 |
| 5,207,835 | 5/1993 | Moore | 118/725 |
| 5,326,725 | 7/1994 | Sherstinsky et al. | 437/225 |
| 5,356,476 | 10/1994 | Foster et al. | 118/725 |

FOREIGN PATENT DOCUMENTS

| | | |
|---|---|---|
| 0272140 | 12/1987 | European Pat. Off. . |
| 0398589 | 5/1990 | European Pat. Off. . |
| 0448346 | 3/1991 | European Pat. Off. . |
| 0456372 | 4/1991 | European Pat. Off. . |
| 0467623 | 7/1991 | European Pat. Off. . |
| WO93/25723 | 12/1993 | WIPO . |

OTHER PUBLICATIONS

Raupp, Gregory B., et al., "Step Coverage of Tungsten Silicide Films Deposited by Low Pressure Dichlorosilane Reduction of Tungsten Hexafluoride", *Thin Solid Films*, vols. 193/194, Nos. 1/2, Dec. 1, 1990, pp. 234–243.

*Primary Examiner*—T. N. Quach
*Attorney, Agent, or Firm*—John P. Taylor

[57] ABSTRACT

A process and is described for forming a tungsten silicide layer on a semiconductor wafer in a deposition chamber which comprises mounting a wafer on a susceptor having a fixed outer diameter regardless of the diameter wafer thereon to be processed in said chamber, and flowing into a deposition chamber a mixture of gases, including dichlorosilane gas and a gaseous source of tungsten through a fixed gas inlet pattern formed in a fixed diameter inlet receptacle, whereby a constant gas flow will be maintained in the deposition chamber regardless of wafer diameter being processed to thereby provide uniform deposition conditions in the deposition chamber, independent of wafer diameter. In this manner the same showerhead is used for all diameters of wafers, and while the susceptor is changed with each size of wafer to be processed, to thereby provide a crown pattern on the susceptor corresponding to the diameter of the wafer being processed, the same outer diameter is used for each susceptor, thereby providing the same dimensioned gap in the same position between the outer edge of the susceptor and a baffle plate surrounding the susceptor, so that the gas flow patterns in the deposition chamber remain constant during deposition, regardless of wafer diameter.

28 Claims, 4 Drawing Sheets

PROCESS FOR FORMING TUNGSTEN SILICIDE ON SEMICONDUCTOR WAFER USING DICHLOROSILANE GAS

BACKGROUND OF THE INVENTION

1. Field of the Invention

This invention relates to a process and apparatus for forming tungsten silicide on a semiconductor wafer. More particularly, this invention relates to a process for forming tungsten silicide from a gaseous mixture comprising dichlorosilane and a tungsten-containing gas wherein constant gas flow conditions are maintained in a deposition chamber regardless of wafer diameter size.

2. Description of the Related Art

In the CVD processes for the depositions of materials, such as, for example, a tungsten silicide CVD process, on semiconductor wafers, the common practice is to provide a separate pattern of inlet gas flow for each size wafer to be processed, which to some extent, matches the diameter of the particular wafer. For example, for a wafer of approximately 200 mm. diameter (~8 inch), typically a 200 mm. (~7.92 inch) diameter gas inlet structure, commonly referred to as a showerhead, and generally illustrated at 2, in FIG. 1A, is typically provided with a 200 mm. (~7.92 inch) diameter pattern of 0.71 mm. (0.028 inch) diameter inlet holes, each spaced apart a distance of about 4.57 mm. (0.18 inches). When a wafer of approximately 150 mm. diameter (~6 inch) is processed, a showerhead of the same outer diameter is conventionally used, as generally illustrated at 4 in FIG. 1B, but the showerhead is now provided with a correspondingly smaller hole pattern (but with the same diameter individual holes) for the admission of process gas into the deposition chamber, even though the same size (inner diameter) chamber is used. Thus, for a 150 mm. diameter wafer, the gas inlet hole pattern is usually also about 150 mm. in diameter. Similarly, for a wafer of approximately 125 mm. diameter (~5 inch), the showerhead, generally illustrated at 6 in FIG. 1C, has the same outer diameter, but the showerhead is provided with a 125 mm. diameter hole pattern for the admission of process gas into the chamber, and an approximately 100 mm. (~4 inch) diameter wafer, as generally illustrated at 8 in FIG. 1D, is provided with a showerhead (of identical outer diameter) with a 100 mm. diameter pattern of inlet gas holes. Side by side comparisons of the gas flow patterns of the four different prior art susceptors shown in FIGS. 1A–1D shows the respective gas flows from the respective showerheads, as indicated by the arrows. It will be readily appreciated that both the gas flow pattern and total volume of gas entering the deposition chamber vary considerably with the difference in wafer diameter in the tungsten silicide deposition process of the prior art, even though the diameter and volume of the deposition chamber remained the same.

The reason for conventionally using such a different pattern of gas inlet holes for each diameter of wafers was to maintain a reactive zone directly above the wafer having outer regions corresponding to the edge of the respective wafers of varying diameters, and to keep the reactive gas concentration consistent over the wafer. It also was thought to be more efficient because if the same gas flow were to be used, for all sizes of wafers, most of the process gases flowed into the chamber for processing the smaller diameter wafers would be pumped out instead of deposited on the wafer.

It is also conventional, in such CVD processes, to use different diameter wafer supports, known as susceptors, for different diameter wafers. Such susceptors are provided, at least in some instances, with small raised portions or crowns on the upper surface of the susceptor which are generally arranged in a circle slightly larger than the diameter of the wafer being processed. The purpose of this pattern of crowns on the wafer support is to inhibit sideways movement or floating of the wafer during the deposition processing. Thus, for a 200 mm. (8 inch) diameter wafer, a susceptor having a diameter slightly larger than 200 mm. (8 inches), for example, from about 210 mm to 229 mm. (~8¼ to ~9 inches), is utilized with a pattern of crowns thereon arranged in a circle having a diameter large enough to permit a 200 mm. (8 inch) diameter wafer to be mounted on the susceptor between the crowns. For a 150 mm. (6 inch) wafer, however, the larger susceptor is replaced in the deposition chamber with a smaller diameter susceptor having, for example, about a 165 mm. to about 178 mm. (~6½ to ~7 inch) diameter, with a pattern of crowns formed on its face permitting the mounting of a 150 mm. (6 inch) diameter wafer thereon between the crowns. Still smaller susceptors are then conventionally used for the processing of 125 mm. (5 inch) and 100 mm. (4 inch) diameter wafers.

FIGS. 2A–2D show side views, respectively, of the four different diameter prior art susceptors conventionally used for 100, 125, 150, and 200 mm. (4, 5, 6, and 8 inch) diameter wafers during CVD processing, with arrows illustrating the respective gas flow paths. In FIG. 2A, the susceptor used conventionally for processing a 200 mm. diameter wafer is shown at 10, having crowns 12 thereon to prevent lateral shifting of 200 mm. wafer 101 mounted thereon, and finger openings 14 through which fingers (not shown) may be inserted to lift wafer 101 off susceptor 10 to facilitate removal (or mounting) of wafer 101 from susceptor 10. As shown in FIG. 2A, a baffle plate 16 surrounds susceptor 10 and may be mounted to, or positioned adjacent, sidewall 52 of the processing chamber. Baffle plate 16 is provided with a central opening 17 therein which is from about 220 mm. to about 240 mm. (~8.65 to ~9.5 inches) in diameter, to thereby define a gap 18 between susceptor 10 and baffle 16, of from about 5.1 mm to about 7.6 mm (~200 mils to ~300 mils) to permit movement of the susceptor toward and away from the showerhead. Openings (not shown) may be provided in baffle 16 to permit the process gases to pass from showerhead 2 (shown in FIG. 1A) and the region above wafer 101 to flow to a vacuum outlet (not shown) on the side of the chamber.

Similarly, in FIG. 2B, the susceptor used conventionally for processing a 150 mm. (6 inch) diameter wafer is shown at 20, having crowns 22 thereon to prevent lateral shifting of 150 mm. diameter wafer 102 mounted thereon, and finger openings 24 through which fingers (not shown) may be inserted to lift wafer 102 off susceptor 20 to facilitate removal (or mounting) of wafer 102 from susceptor 20. As shown in FIG. 2B, a baffle plate 26 surrounds susceptor 20 and may be mounted to, or positioned adjacent, sidewall 52 of the processing chamber. Baffle plate 26 is provided with a central opening 27 therein which is sufficiently larger than the diameter of susceptor 20 to thereby define a gap 28 between susceptor 20 and baffle 26, similar in width to gap 18 in FIG. 2A, i.e., which also ranges from about 5.1 mm to about 7.6 mm (~200 mils to ~300 mils) to permit movement of susceptor 20.

In FIG. 2C, the susceptor used conventionally for processing a 125 mm. (5 inch) diameter wafer is shown at 30, having crowns 32 thereon to prevent lateral shifting of 125 mm. diameter wafer 103 mounted thereon, and finger openings 34 through which fingers (not shown) may be inserted to lift wafer 103 off susceptor 30 to facilitate removal (or mounting) of wafer 103 from susceptor 30. As shown in FIG. 2C, a baffle plate 36 surrounds susceptor 30 and may be mounted to, or positioned adjacent, sidewall 52 of the processing chamber. Baffle plate 36 is provided with a central opening 37 therein which is sufficiently larger than the diameter of susceptor 30 to thereby define a gap 38 of the same width as gaps 18 and 28 between susceptor 30 and baffle 36 to permit movement of susceptor 30.

Similarly, in FIG. 2D, the susceptor used conventionally for processing a 100 mm. (4 inch) diameter wafer is shown at 40, having crowns 42 thereon to prevent lateral shifting of 100 mm. diameter water 104 mounted thereon, and finger openings 44 through which fingers (not shown) may be inserted to lift wafer 104 off susceptor 40 to facilitate removal (or mounting) of wafer 104 from susceptor 40. As shown in FIG. 2D, a baffle plate 46 surrounds susceptor 40 and may be mounted to, or positioned adjacent, sidewall 52 of the processing chamber. Baffle plate 46 is provided with a central opening 47 therein which is sufficiently larger than the diameter of susceptor 40 to thereby define a gap 48 between susceptor 40 and baffle 46 of the same width as gaps 18, 28, and 38 to permit movement of susceptor 40.

The reason for changing the diameter of the susceptors, when changing from a 200 mm. (8 inch) wafer to a 150, 125, or 100 mm. wafer, rather than using a standardized diameter for the respective susceptors was similar to the reasons for changing the showerhead hole pattern sizes for different size wafers, i.e., to maintain a gas flow/hot susceptor space consistent with the wafer diameter. Also for depositions on smaller wafers, by using a smaller susceptor, the cost of the susceptor could be reduced, there was less total deposition resulting in a shorter chamber cleaning time, and an increased throughput.

This use of different showerheads with differing hole patterns for the inlet gases flowing into a given size chamber provides a different inlet processing gas flow pattern for each size wafer being processed in the deposition chamber. Furthermore, such differences in inlet flow of the process gases, coupled with the use of susceptors of differing outer diameters and baffles of differing inner diameters, interposed between the inlet flow at one end of the deposition chamber and the outlet flow to a vacuum pump at the other end of the chamber, so that the annular gap between susceptor and baffle is located at a different place in the deposition chamber for each size wafer, results in a large variance in the conventional gas flow patterns in the deposition chamber between depositions on 100, 125, 150, and 200 mm. diameter wafers.

However, in the conventional deposition of materials such as CVD tungsten silicide depositions, such disparities in the flow rates and flow patterns used for the various diameter wafers has not been a problem. Apparently when forming tungsten silicide by a CVD process using a source of tungsten such as tungsten hexafluoride ($WF_6$) and a source of silicon such as silane ($SiH_4$), the activation energy of the silane gas is sufficient high to permit reaction of the silane with the tungsten hexafluoride on a repeatable and reliable basis despite such changes in gas flow rates and patterns when changing from a tungsten silicide deposition, for example, on a 200 mm. (~8 inch) wafer to a 100 mm. (~4 inch) wafer.

However, to improve the step coverage of the deposited tungsten silicide, as well as to lower the fluorine content in the tungsten silicide, dichlorosilane (DCS), having the formula $SiH_2Cl_2$, has been used as a replacement gas for the silane used in the prior art processing. While this has, in some instances, improved the quality of the deposited tungsten silicide film, it has been found that the CVD process for the deposition of tungsten silicide, using DCS as the source of silicon, is very sensitive to such previously discussed changes in the gas flow rates and flow patterns present in the chamber during the deposition, resulting in the need to constantly readjust temperatures, pressures, and flow rates when changing from one diameter wafer to another. Such restrictions have, in turn, limited the optimization of the deposition uniformity when using DCS as the source of silicon.

It would, therefore, be desirable to provide a process and apparatus for the CVD formation of a tungsten silicide coating using a dichlorosilane source of silicon, which process could be used for wafers of differing diameters with little or no changes necessary in either processing parameters or hardware utilized.

SUMMARY OF THE INVENTION

The invention comprises a process for forming a tungsten silicide layer on various diameters of semiconductor wafers in a deposition chamber, using dichlorosilane as the source of silicon, which comprises mounting a wafer on a susceptor having a fixed outer diameter, and spaced a fixed distance from baffle means in the chamber surrounding the susceptor, regardless of the diameter of the wafer thereon to be processed in the chamber, and flowing into the deposition chamber a mixture of gases, including dichlorosilane gas and a gaseous source of tungsten, through a fixed gas inlet pattern in a fixed diameter inlet receptacle, whereby a constant gas flow pattern will be maintained in the deposition chamber regardless of wafer diameter being processed, to thereby provide uniform tungsten silicide deposition conditions in the deposition chamber, independent of wafer diameter.

DETAILED DESCRIPTION OF THE INVENTION

The invention comprises a CVD process and apparatus for depositing a layer of tungsten silicide on a semiconductor wafer in a deposition chamber, using dichlorosilane as the source of silicon, by mounting a wafer on a susceptor having a fixed outer diameter, and spaced a fixed distance from baffle means in said chamber surrounding the susceptor, regardless of the diameter of the wafer thereon to be processed in the chamber, and flowing into the deposition chamber a mixture of gases, including dichlorosilane gas and a gaseous source of tungsten, through a fixed gas inlet pattern in a fixed diameter inlet receptacle, whereby a constant gas flow pattern will be maintained in the deposition chamber regardless of the diameter of the wafer being processed to thereby provide uniform tungsten silicide deposition conditions in the deposition chamber, independent of wafer diameter.

Figure 3:
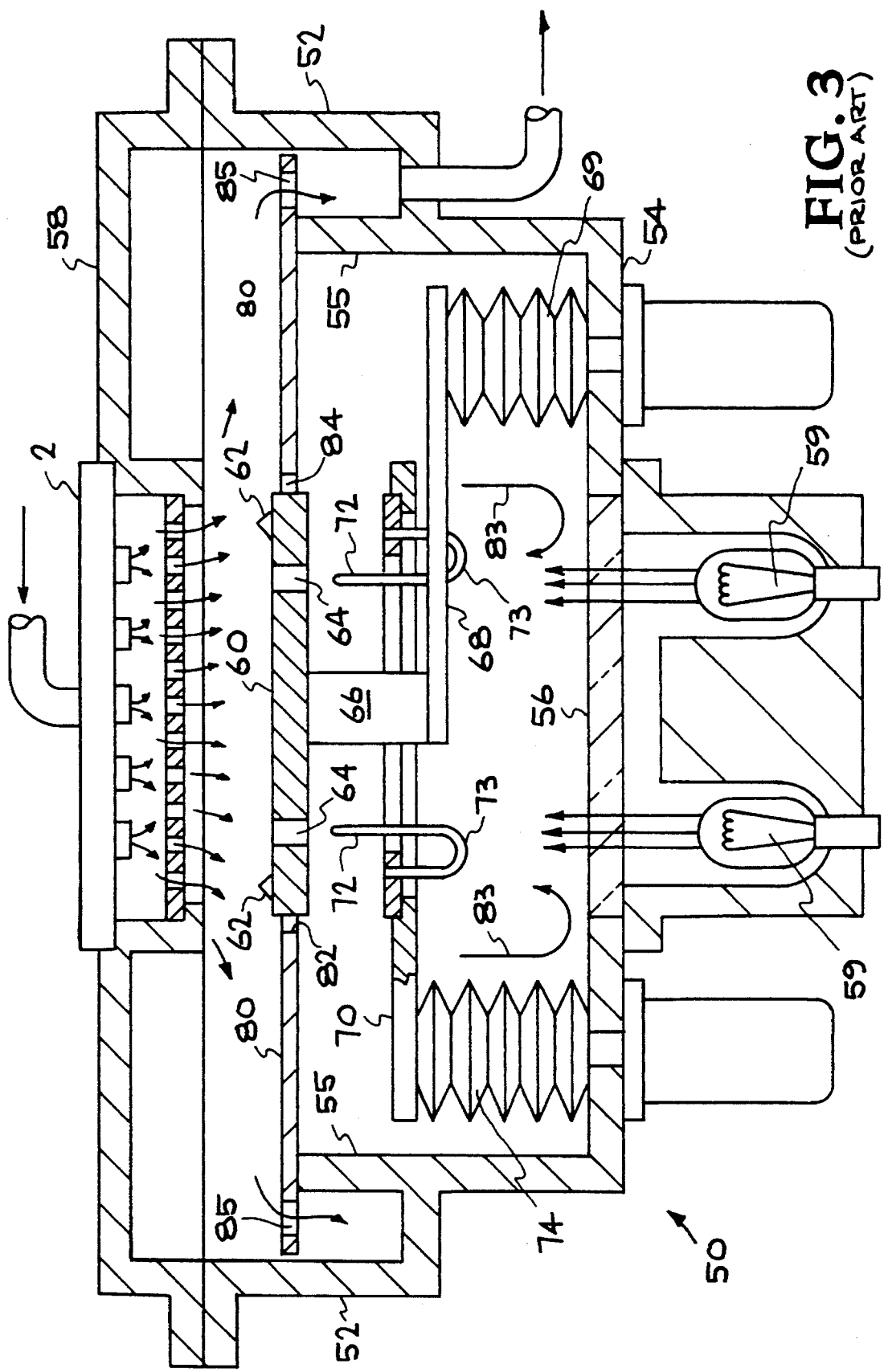
FIG. 3 is a vertical cross-sectional via of a typical prior art CVD processing apparatus which may be used in the practice of the process of the invention, and into which may be fitted the apparatus modifications which will permit the processing of 150, 125, and 100 mm. diameter wafers, as well as 200 mm. diameter wafers.
Figure 3A:
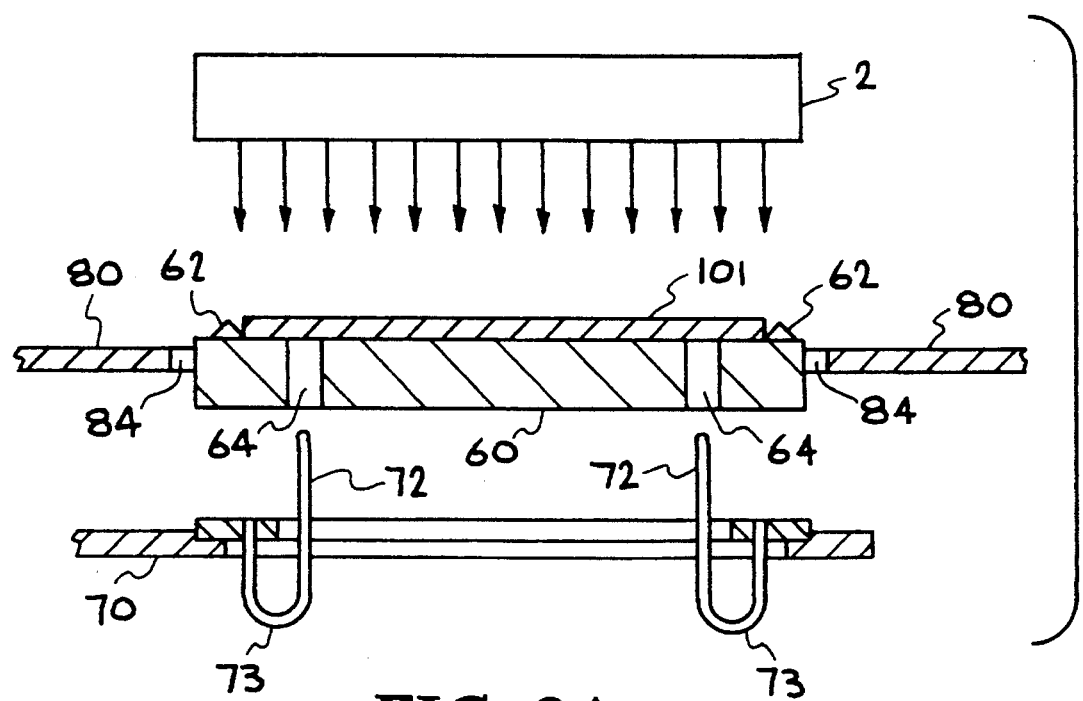
FIG. 3A is a vertical cross-sectional fragmentary view showing the showerhead, susceptor, and baffle plate conventionally used in the prior art to deposit tungsten silicide on a 200 mm. wafer using dichlorosilane as the source of silicon.

Now referring to FIGS. 3 and 3A, a typical prior art CVD chamber, is generally indicated at 50, which may be used with the process and apparatus of the invention to deposit tungsten silicide on a wafer, using dichlorosilane gas, and under generally constant processing conditions, regardless of wafer diameter. Chamber 50 has a generally cylindrical sidewall 52, a bottom wall 54, having a quartz window 56 therein, and a top wall 58. A radiant heating lamp reflector module 59 may be exteriorly mounted to chamber 50 adjacent quartz window 56 to provide a heating source to heat the wafer therein during the deposition process.

Centrally mounted within chamber 50 is a wafer support or susceptor 60, having a diameter ranging from about 210 mm. (8¼ inches) to about 229 mm. (9 inches) Susceptor 60 is provided with crowns 62 thereon spaced in a circle of slightly larger than 200 mm. in diameter to prevent lateral shifting of a 200 mm. (8 inch) wafer mounted thereon. Susceptor 60 is also provided with finger openings 64 through which fingers 72 may be inserted to lift the wafer off susceptor 60 to facilitate removal or mounting of the wafer off or on susceptor 60 (as will be discussed below). Finger openings 64 may be positioned in susceptor 60 in a generally circular or polygonal pattern of from about 5 cm. (2 inches) to about 10 cm. (4 inches) in radius, typically about 7.5 cm. (3 inches) in radius, to facilitate engagement of the undersurface of the 200 mm. (8 inch) diameter wafer.

Susceptor 60 is mounted on a central support 66, which is, in turn, supported by susceptor lift arm 68. Susceptor lift arm 68 is coupled through bellows means 69 to a lift mechanism (not shown) which may be used to raise susceptor 60 and a semiconductor wafer thereon into a deposition position and then to lower susceptor 60 to a position where a wafer thereon may be removed after processing.

Chamber 50 is further provided with means for lowering (or raising) a wafer onto (or off of) susceptor 60 comprising a cylindrical ring 70 having three or more fingers 72 detachably mounted thereon which pass through previously described finger openings 64 in susceptor 60 to engage the underside of a wafer to raise the wafer off of susceptor 60 or to lower the wafer onto susceptor 60. Cylindrical ring 70 may have a diameter of from about 22.8 cm. (9 inches) to about 28 cm. (11 inches) and lateral portion 73 of fingers 72 may then be dimensioned to accommodate the actual diameter of the pattern of finger openings 64, relative to the diameter of ring 70. Cylindrical ring 70 is coupled, through bellows means 74, to a lift mechanism (not shown) for raising a lowering cylindrical ring 70 and fingers 72 thereon.

Chamber 50 is also provided with an inner annular shoulder 55 which supports a baffle plate 80. Baffle plate 80 is provided with a central circular opening 82 which is slightly larger than the outer diameter of susceptor 60 so as to provide a gap 84 therebetween of about 5.1 mm. (200 mils) to about 7.6 mm. (300 mils) to permit movement of susceptor 60 and fingers 72. Process gasses flowing into chamber 50, as will be described below, flow through openings 85 in baffle plate 80 which lead to a vacuum pump (not shown). It should be noted here that while gap 84 is provided in baffle plate 80 to permit movement of susceptor 60 and fingers 72, some process gases may flow through this gap and swirl around in the volume below susceptor 60, as shown by arrows 83 in FIG. 3, which can impact flow patterns of the process gases in the chamber. By providing the same diameter susceptor for all sizes of wafers, in accordance with the invention as will be described below, gap 84 will be in the same position, regardless of what size wafer is being processed, thus providing a continuity of whatever gas flow patterns are occurring in the chamber during the deposition regardless of wafer size.

Figure 1A:
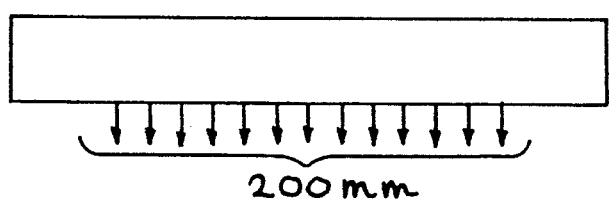
FIG. 1A is a vertical cross-section view of a prior art showerhead used for the flow of process gases into a deposition chamber during the deposition of tungsten silicide on a 200 mm.(~8 inch) diameter wafer.
Figure 1B:
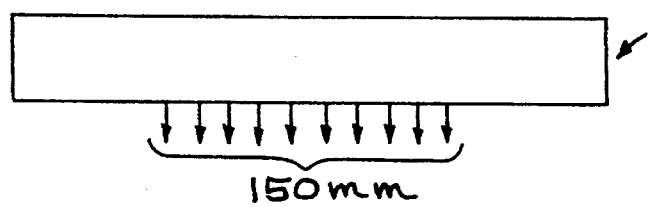
FIG. 1B is a vertical cross-section view of a prior art showerhead used for the flow of process gases into a deposition chamber during the deposition of tungsten silicide on a 150 mm. (~6 inch) diameter wafer.
Figure 1C:
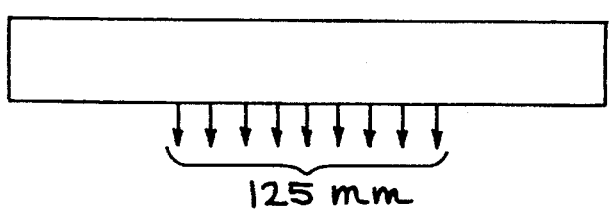
FIG. 1C is a vertical cross-section view of a prior art showerhead used for the flow of process gases into a deposition chamber during the deposition of tungsten silicide on a 125 mm. (~5 inch) diameter wafer.
Figure 1D:
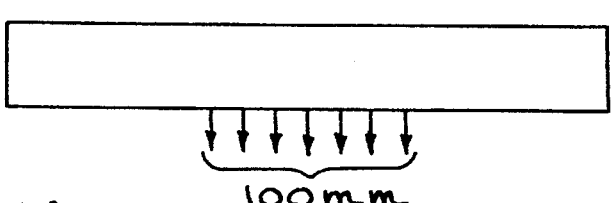
FIG. 1D is a vertical cross-section view of a prior art showerhead used for the flow of process gases into a deposition chamber during the deposition of tungsten silicide on a 100 mm. (~4 inch) diameter wafer.
Figure 2A:
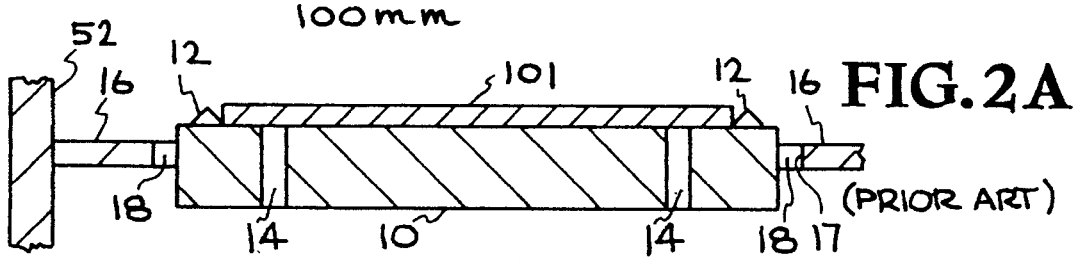
FIG. 2A is a vertical cross-sectional fragmentary view of a prior art susceptor and baffle for the support of a 200 mm. diameter wafer shown mounted in a deposition chamber during the deposition of tungsten silicide on a 200 mm. diameter wafer, showing the lateral position of the gap between the outer edge of the susceptor and the inner edge of the surrounding baffle plate through which gap the process gases may pass.
Figure 2B:
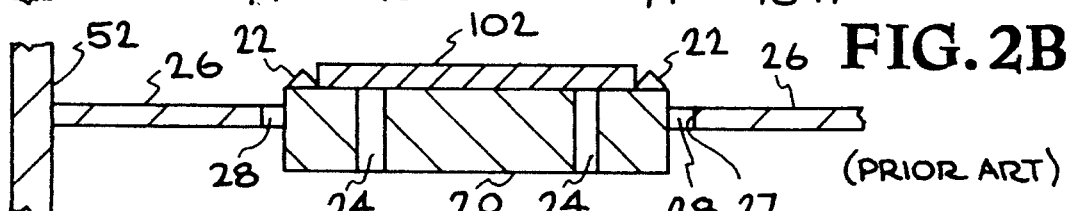
FIG. 2B is a vertical cross-sectional fragmentary view of a prior art susceptor and baffle for the support of a 150 mm. diameter wafer shown mounted in a deposition chamber during the deposition of tungsten silicide on a 150 mm. diameter wafer, showing the lateral position of the gap between the outer edge of the susceptor and the inner edge of the surrounding baffle plate through which gap the process gases pass.
Figure 2C:
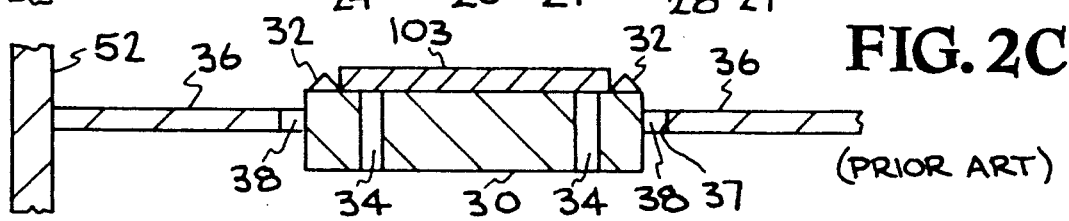
FIG. 2C is a vertical cross-sectional fragmentary view of a prior art susceptor and baffle for the support of a 125 mm. diameter wafer shown mounted in a deposition chamber during the deposition of tungsten silicide on a 125 mm. diameter wafer, showing the lateral position of the gap between the outer edge of the susceptor and the inner edge of the surrounding baffle plate through which gap the process gases pass.
Figure 2D:
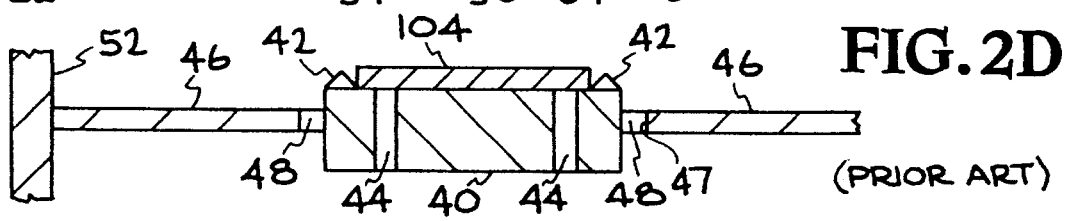
FIG. 2D is a vertical cross-sectional fragmentary view of a prior art susceptor and baffle for the support of a 100 mm. diameter wafer shown mounted in a deposition chamber during the deposition of tungsten silicide on a 100 mm. diameter wafer, showing the lateral position of the gap between the outer edge of the susceptor and the inner edge of the surrounding baffle plate through which gap the process gases pass.

Positioned directly above susceptor 60 is a gas inlet or showerhead 2 through which the process and carrier gasses flow into chamber 50 to contact a wafer mounted on susceptor 60. Showerhead 2, as previously described and illustrated in FIG. 1A, is a gas inlet structure which is typically about 200 mm. (7.92 inch) in diameter, but which may range from about 180 mm. (7.1 inches) to about 220 mm. (8.66 inches) in diameter. Showerhead 2 is provided with a pattern of 0.71 mm. (0.028 inch) diameter inlet holes, which pattern is also typically arranged in a 200 mm. (7.92 inch) diameter, but which may also range between from about 180 mm. (7.1 inches) to about 220 mm. (8.66 inches), depending upon the diameter of showerhead 2, with each hole spaced apart a distance of about 4.57 mm. (0.18 inches).

Figure 4:
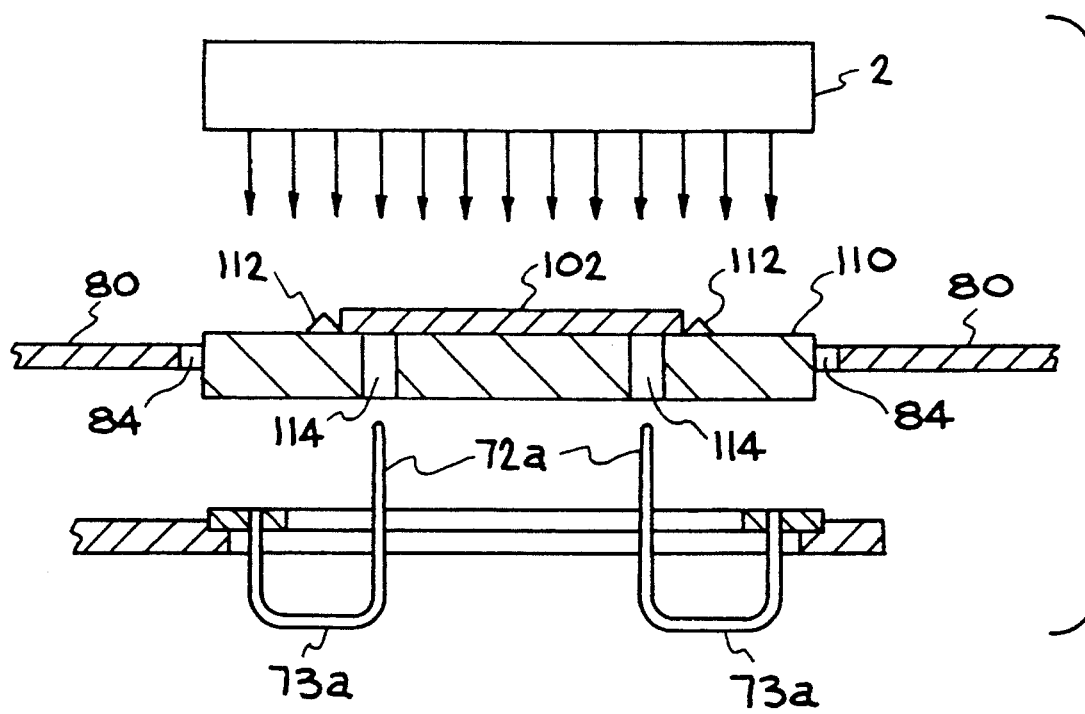
FIG. 4 is a vertical cross-sectional fragmentary view showing the showerhead, modified susceptor, and baffle plate used to deposit tungsten silicide on a 150 mm. wafer using dichlorosilane as the source of silicon, and, in accordance with the invention, using substantially the same process conditions used to deposit the tungsten silicide on a 200 mm. wafer.

In accordance with the invention, when 150 mm. (6 inch) diameter wafer 102 is to be processed in chamber 50, instead of 200 mm. diameter wafer 101, susceptor 60 is removed from chamber 50 and replaced with susceptor 110, which is shown in FIG. 4. Susceptor 110, although having the same outer diameter as susceptor 60, is provided with a crown pattern 112 thereon which is slightly larger than 150 cm. in diameter to thereby receive 150 mm. wafer 102 therebetween and to restrain wafer 102 against lateral movement on susceptor 110 during processing. Susceptor 110 is also provided with finger openings 114 therein, spaced in a generally circular or polygonal pattern of from about 3.8 cm. (1.5 inches) to about 7.6 cm. (3 inches) in radius, typically about 5.7 cm. (2.25 inches) in radius, to receive fingers 72a to permit movement of wafer 102 on and off susceptor 110. Fingers 72 are then removed from ring 70 (shown in FIG. 3) and replaced with fingers 72a which have a smaller lateral portion 73a to accommodate the smaller pattern of finger openings 114 provided on susceptor 110 for the smaller diameter of wafer 102.

It will be noted, from a comparison of FIG. 3A with FIG. 4, that despite the replacement of susceptor 60 with susceptor 110, in accordance with the invention, to thereby permit processing of 150 mm. wafer 102 instead of 200 mm. wafer 101, the gas flow patterns are essentially unchanged. That is, the same showerhead 2 is used for the processing of both wafers 101 and 102, the same outer diameter is maintained for susceptors 60 and 110, and the same baffle plate 80 is used, thereby resulting in the same gap 84, of from about 5 mm (200 mils) to 7.5 mm. (300 mils), which is maintained between baffle plate 80 and susceptor 110 shown in FIG. 4 in the same position in the deposition chamber as the gap 84 between baffle plate 80 and susceptor 60 shown in FIG. 3A.

This continuity of gas flow patterns in the deposition chamber, regardless of the size of the wafer being processed, is deemed to be an important part of the present invention. It should be further noted, in this regard, that although we do not wish to be bound by any theories of operation of the process of the invention, it is believed that the provision of the large mixing area for the gases in the deposition chamber, by virtue of the large hole pattern used in the 200 mm. (8 inch) diameter showerhead, for all of the sizes of wafers being processed, regardless of the diameter of the wafer, may improve the $SiH_2Cl_2/WSi_x$ reaction initiation.

Figure 5:
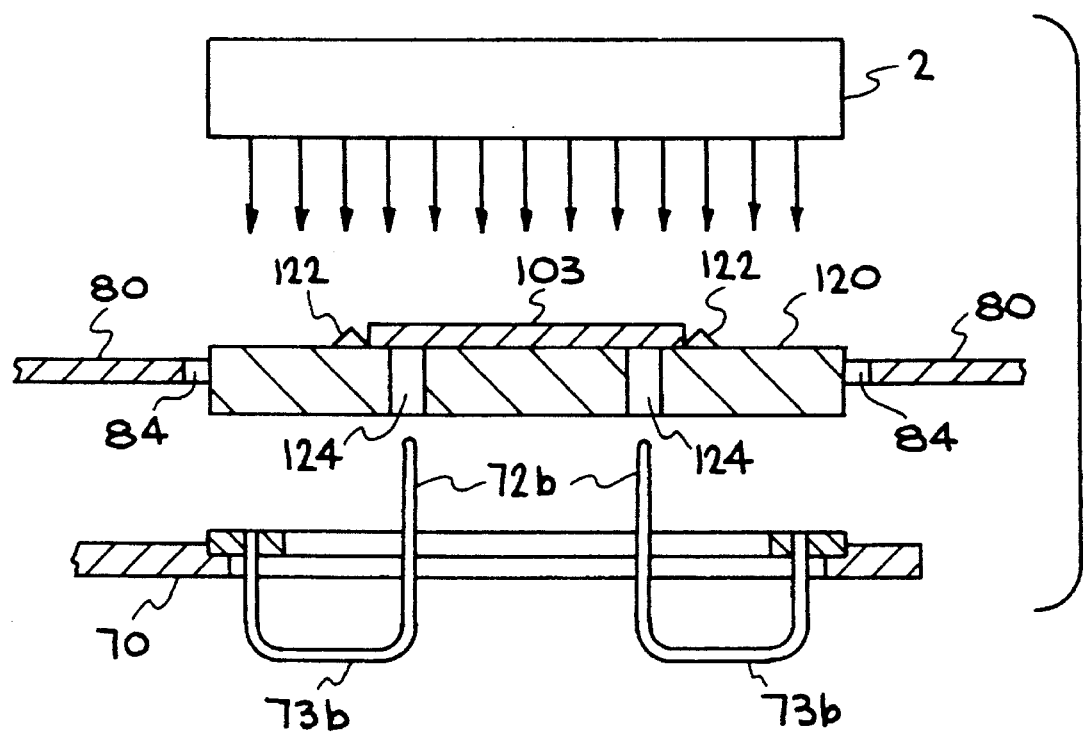
FIG. 5 is a vertical cross-sectional fragmentary view showing the showerhead, modified susceptor, and baffle plate used to deposit tungsten silicide on a 125 mm. wafer using dichlorosilane as the source of silicon, and, in accordance with the invention, using substantially the same process conditions used to deposit the tungsten silicide on a 200 mm. wafer.

Referring now to FIG. 5, in accordance with the invention, when depositing tungsten silicide on 125 mm. (5 inch) diameter wafer 103, using dichlorosilane as the source of silicon, a susceptor 120 is used, having the same outer diameter as susceptor 60, but having crowns 122 thereon arranged in a circular pattern to receive 125 mm. diameter wafer 103 and to secure wafer 103 against lateral movement on susceptor 120. Susceptor 120 is also provided with finger openings 124 therein, spaced in a generally circular or polygonal pattern of from about 3.18 cm. (1.25 inches) to about 6.35 cm. (2.5 inches) in radius, typically about 4.75 cm. (1.87 inches) in radius, to receive fingers 72a to permit engagement of the underside of 125 mm. (5 inch) wafer 103. Fingers 72b, having a suitably dimensioned lateral portion 73b, are then fitted on ring 70 to be received in finger openings 124 of susceptor 120. As mentioned above, with respect to FIG. 4, the same susceptor is used and the same gap 84, of from about 5 mm (200 mils) to 7.5 mm. (300 mils), is maintained between susceptor 120 and baffle plate 80, in the same position in the deposition chamber, resulting in the same gas flow pattern as in the previous processing of wafers 101 and 102.

Figure 6:
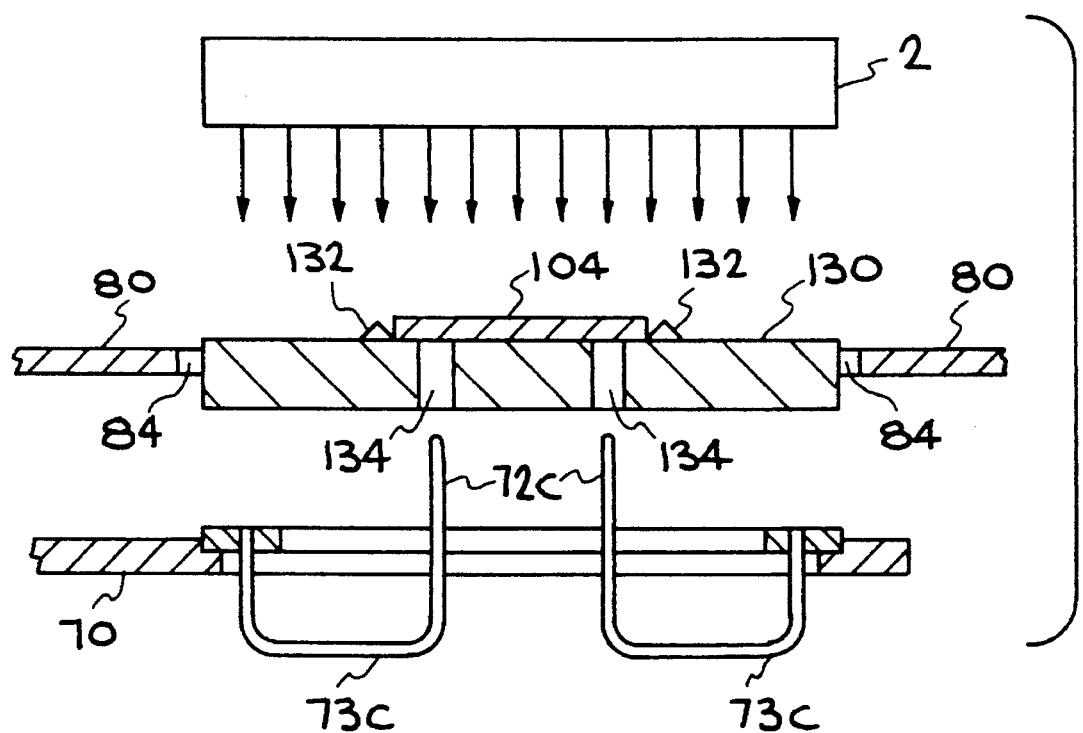
FIG. 6 is a vertical cross-sectional fragmentary view showing the showerhead, modified susceptor, and baffle plate used to deposit tungsten silicide on a 100 mm. wafer using dichlorosilane as the source of silicon, and, in accordance with the invention, using substantially the same process conditions used to deposit the tungsten silicide on a 200 mm. wafer.

Similarly, in FIG. 6, in accordance with the invention, when depositing tungsten silicide on 100 mm. (4 inch) diameter wafer 104, using dichlorosilane as the source of silicon, a susceptor 130 is used, having the same outer diameter as susceptor 60, but having crowns 132 thereon arranged in a circular pattern to receive 100 mm. diameter wafer 104 and to secure wafer 104 against lateral movement on susceptor 130. Susceptor 130 is also provided with finger openings 134 therein, spaced in a generally circular or polygonal pattern of from about 2.54 cm. (1 inch) to about 5.1 cm. (2 inches) in radius, typically about 3.8 cm. (1.5 inches) in radius, to receive fingers 72a to permit engagement of the underside of 100 mm. wafer 104. Fingers 72c, having a suitably shortened lateral portion 73c, are then fitted on ring 70 to be received in finger openings 134 of susceptor 130. As in FIGS. 4 and 5, the same showerhead 2 is used, and the same gap 84 of from about 5 mm (200 mils) to about 7.5 mm. (300 mils) is maintained between susceptor 104 and baffle plate 80, in the same position in the deposition chamber, resulting in the same gas flow patterns maintained when processing 100 mm. diameter wafer 104 as with the previous size wafers.

Thus, in contrast to prior art attempts to deposit tungsten silicide on various diameter wafers, using dichlorosilane as the source of silicon, regardless of the wafer size being deposited on, the deposition parameters are held constant. That is, the temperature range of the wafer during the tungsten silicide deposition is maintained within a range of from about 550° C. to about 600° C.; the pressure in the deposition chamber is maintained within a range of from about 500 milliTorr to about 10 Torr, and preferably from about 1 to 2 Torr; the flow of $WF_6$ gas into the chamber is maintained within a range of about 3–5 standard cubic centimeters per second (sccm), preferably about 4 sccm; the flow of dichlorosilane ($SiH_2Cl_2$) is maintained with a range of from about 130 sccm to about 300 sccm, preferably about 130 sccm to 175 sccm, and typically about 150 sccm; and the flow of carrier gas such as argon is maintained within a range of from about 200 sccm to about 1000 sccm, and preferably from about 400 sccm to about 800 sccm.

To further illustrate the process and apparatus of the invention, a series of about 100 each of 200 mm. (8 inch) and 150 mm. (6 inch) wafers were processed in the same apparatus to form a CVD layer of tungsten silicide thereon, using dichlorosilane as the source of silicon. In each instance, the temperature of the wafer was maintained within the range of from about 550° C. to about 600° C., the pressure was maintained between about 1–2 Torr, the WF$_6$ gas flow was about 4 sccm, the SiH$_2$Cl$_2$ gas flow was about 200 sccm, and the argon carrier gas flow was about 600 sccm. Only the susceptors and fingers were changed when changing from the processing of one diameter wafer to another, with all of the process conditions essentially remaining the same.

Examination of the tungsten silicide coatings respectively formed on the 100 wafers of 200 mm. diameter, and the 100 wafers of 150 mm. diameter was carried out by Rutherford Backscattering Spectroscopy (RBS) to determine the tungsten/silicon ratio of the final film (the composition) formed respectively on the 200 mm. and 150 mm. diameter wafers. The results of the examination of the 200 wafers showed that the tungsten/silicon ratio of the final films (composition) formed on the wafers were uniform in thickness and in quality, regardless of the diameter of the wafer being processed, thus showing the repeatability of the process of the invention from wafer to wafer.

Thus, the process and apparatus of the invention provides for the uniform processing of various diameter wafers to provide a CVD deposition of tungsten silicide thereon, using dichlorosilane (SiH$_2$Cl$_2$) as the source of silicon, without requiring the adjustment of various process parameters such as temperature, pressure, and gas flows, for different diameter wafers, by maintaining a constant gas flow pattern and gas flow through the chamber, regardless of wafer diameter, by using the same showerhead dimensions for the inlet gas flow and the same baffle means and susceptor outer diameter to thereby provide not only the same size gap, but also the same location of the gap within the deposition chamber to thereby maintain the uniformity of the gas flow pattern through the chamber regardless of the diameter of the wafer being processed therein.

Having thus described the invention what is claimed is:

1. A CVD process for forming a tungsten silicide layer on a semiconductor wafer in a deposition chamber which comprises:
    a) mounting a wafer on a susceptor having a fixed outer diameter regardless of the diameter of the wafer thereon to be processed in said chamber;
    b) flowing into said deposition chamber a mixture of gases, including dichlorosilane gas and a gaseous source of tungsten through a fixed gas inlet pattern formed in a fixed diameter inlet receptacle; and
    c) depositing a layer of tungsten silicide on said wafer; whereby a constant gas flow pattern will be maintained in said deposition chamber regardless of wafer diameter being processed to thereby provide uniform deposition conditions in said deposition chamber, independent of wafer diameter.

2. The process of claim 1 wherein said gases flow into said chamber through a perforated plate having a circular pattern of holes therein facing said wafer, said pattern ranging from about 180 mm. to about 220 mm. in diameter.

3. The process of claim 2 wherein said perforated plate has a diameter ranging from about 180 mm. to about 220 mm.

4. The process of claim 1 wherein the flow rate of said dichlorosilane flowing into said chamber ranges from about 130 sccm to about 300 sccm.

5. The process of claim 4 wherein said flow rate of said dichlorosilane flowing into said chamber ranges from about 130 sccm to about 175 sccm.

6. The process of claim 4 wherein said gaseous source of tungsten flowing into said chamber comprises tungsten hexafluoride and the flow rate of said tungsten hexafluoride flowing into said chamber ranges from about 3 sccm to about 5 sccm.

7. The process of claim 6 wherein a carrier gas is also flowed into said chamber with said dichlorosilane and said tungsten hexafluoride, and the rate of flow of said carder gas into said chamber ranges from about 400 sccm to about 800 sccm.

8. The process of claim 1 wherein said deposition chamber is provided with a baffle plate adjacent said susceptor, said baffle plate having an inner opening surrounding said susceptor to thereby provide a gap between outer edge of said susceptor and said inner opening of said baffle plate which is located in the same position in said chamber regardless of the diameter of the wafer being processed in said chamber, to thereby maintain the same gas flow pattern in said chamber regardless of wafer diameter.

9. The process for CVD formation of a tungsten silicide layer on a wafer of claim 8 including the step of processing a 150 mm. wafer in said deposition chamber using a susceptor having an outer diameter of from about 210 mm. (8¼ inches) to about 229 mm. (9 inches) to thereby provide a fixed gap through which process gasses pass between said susceptor and said baffle ranging from about 5.1 mm. (200 mils) to about 7.6 mm. (300 mils); said susceptor having a circular pattern of raised members, on the surface thereof supporting said wafer, defining a circle of slightly greater than 150 mm. whereby said 150 mm. diameter wafer will be inhibited from lateral movement on said susceptor by said raised members; said susceptor having openings therein beneath said wafer to permit fingers to be inserted therethrough to facilitate raising said wafer from said surface of said susceptor.

10. The process for CVD formation of a tungsten silicide layer on a wafer of claim 8 including the step of processing a 125 mm.(5 inch) wafer in said deposition chamber using a susceptor for said 125 mm. wafer having an outer diameter of from about 210 mm. (8¼ inches) to about 229 mm. (9 inches) to thereby provide a fixed gap through which process gasses pass between said susceptor and said baffle ranging about 5.1 mm. (200 mils) to about 7.6 mm. (300 mils); said susceptor having a circular pattern of raised members, on the surface thereof supporting said wafer, defining a circle of slightly greater than 125 mm., whereby said 125 mm. diameter wafer will be inhibited from lateral movement on said susceptor by said raised members; said susceptor having openings therein beneath said wafer to permit fingers to be inserted therethrough to facilitate raising said wafer from said surface of said susceptor.

11. The process for CVD formation of a tungsten silicide layer on a wafer of claim 8 including the step of processing a 100 mm. (4 inch) wafer in said deposition chamber using a susceptor for said 100 mm. wafer having an outer diameter of from about 210 mm. (8¼ inches) to about 229 mm. (9 inches) to thereby provide a fixed gap through which process gasses pass between said susceptor and said baffle ranging about 5.1 mm. (200 mils) to about 7.65 mm. (300 mils); said susceptor having a circular pattern of raised members, on the surface thereof supporting said wafer, defining a circle of slightly greater than 100 mm., whereby said 100 mm. diameter wafer will be inhibited from lateral movement on said susceptor by said raised members; said susceptor having openings therein beneath said wafer to permit fingers to be inserted therethrough to facilitate raising said wafer from said surface of said susceptor.

12. The process of claim 1 including the further step of providing on said susceptor a first pattern of raised portions arranged along a circular locus of diameter slightly greater than said wafer to laterally retain said wafer on said susceptor.

13. The process of claim 12 including the further steps of:
   a) removing said wafer from said chamber;
   b) then removing said susceptor from said chamber;
   c) replacing said susceptor with a second susceptor, having the same said fixed outer diameter as said replaced susceptor, said second susceptor having a second pattern of raised portions arranged along a circular locus of diameter different than said first pattern of raised points to permit retention on said second susceptor of a second wafer having an outer diameter that said wafer removed from said chamber.

14. The process of claim 26 wherein said step of flowing said gases into said chamber is performed through said gas outlets defined in a circular pattern facing said susceptor, said pattern having an outer diameter at least as large as that of the largest wafer to be processed.

15. The process of claim 26 which includes the further step of providing a gap defined by a baffle plate mounted within said chamber and surrounding the susceptor mounting position within said chamber, the position and dimension of said gap being preserved despite any changes in susceptors as wafers of differing diameters are processed.

16. A CVD process for forming a tungsten silicide layer on a semiconductor wafer in a deposition chamber which comprises:
   a) mounting a wafer on a susceptor in said chamber having a fixed outer diameter smaller than a baffle plate in said chamber surrounding the outer edge of said susceptor to thereby form a gap therebetween for process gas flow therethrough of the same size and in the same location in said chamber regardless of the diameter of the wafer thereon to be processed in said chamber;
   b) flowing into a deposition chamber a mixture of gases comprising:
      i) dichlorosilane gas;
      ii) a gaseous source of tungsten; and
      iii) a carrier gas; through a fixed gas inlet pattern of holes, regardless of wafer size, which hole pattern is formed in a fixed diameter inlet receptacle; and
   c) depositing a layer of tungsten silicide on said wafer; whereby a constant gas flow will be maintained in said deposition chamber regardless of wafer diameter being processed to thereby provide uniform deposition conditions in said deposition chamber, independent of wafer diameter.

17. The process of claim 16 wherein said step of flowing said mixture of gases into said chamber further comprises flowing into said chamber:
   a) from about 130 sccm to about 300 sccm of dichlorosilane gas;
   b) from about 3 sccm to about 5 sccm of a gaseous source of tungsten; and
   c) from about 200 sccm to about 1000 sccm of a carrier gas.

18. The process of claim 17 wherein said flow rate of dichlorosilane flowing into said chamber ranges from about 130 sccm to about 175 sccm.

19. The process of claim 17 wherein said flow rate of said dichlorosilane flowing into said chamber is about 150 sccm; said gaseous source of tungsten comprises $WF_6$; and the flow rate of said $WF_6$ is about 4 sccm.

20. The process of claim 9 wherein said step of flowing said mixture of gases into said chamber through said fixed gas inlet pattern of holes further comprises flowing said gas into said chamber through a fixed pattern of holes ranging in diameter from about 180 mm. to about 220 mm.

21. The process of claim 16 wherein said baffle plate include a central opening therein surrounding said outer edge of said susceptor to define said gap.

22. The process of claim 21 wherein said gap between said outer edge of said susceptor and said inner opening of said baffle plate ranges from about 5.1 mm. to about 7.6 mm.

23. In a deposition process for CVD formation of a tungsten silicide layer on a wafer using dichlorosilane as a source of silicon wherein a CVD deposition apparatus includes a baffle provided with a central opening therein surrounding the susceptor therein used for support of a wafer during deposition, the improvement which comprises providing a susceptor for supporting a 150 mm. (6 inch) wafer in said deposition apparatus; said susceptor for said 150 mm. wafer having an outer diameter of from about 210 mm. (8¼ inches) to thereby provide a fixed gap through which process gasses pass between said susceptor and said baffle ranging from about 5.1 mm. (200 mils) to about 7.6 mm. (300 mils); said susceptor having a circular pattern of raised members, on the surface thereof supporting said wafer, defining a circle of slightly greater than 150 mm. whereby said 150 mm. diameter wafer will be inhibited from lateral movement on said susceptor by said raised members; and said susceptor having openings therein beneath said wafer to permit fingers to be inserted therethrough to facilitate raising said wafer from said surface of said susceptor.

24. In a deposition process for CVD formation of a tungsten silicide layer on a wafer using dichlorosilane as a source of silicon wherein a CVD deposition apparatus includes a baffle provided with a central opening therein surrounding the susceptor therein used for support of a wafer during deposition, the improvement which comprises providing a susceptor for supporting a 125 mm. (5 inch) wafer in said deposition apparatus; said susceptor for said 125 mm. wafer having an outer diameter of from about 210 mm. (8¼ inches) to thereby provide a fixed gap through which process gasses pass between said susceptor and said baffle ranging about 5.1 mm. (200 mils) to about 7.6 mm. (300 mils); said susceptor having a circular pattern of raised members, on the surface thereof supporting said wafer, defining a circle of slightly greater than 125 mm., whereby said 125 mm. diameter wafer will be inhibited from lateral movement on said susceptor by said raised members; and said susceptor having openings therein beneath said wafer to permit fingers to be inserted therethrough to facilitate raising said wafer from said surface of said susceptor.

25. In a deposition process for CVD formation of a tungsten silicide layer on a wafer using dichlorosilane as a source of silicon wherein a CVD deposition apparatus includes a baffle provided with a central opening therein surrounding the susceptor therein used for support of a wafer during deposition, the improvement which comprises providing a susceptor for supporting a 100 mm. (4 inch) wafer in said deposition apparatus; said susceptor for said 100 mm. wafer having an outer diameter of from about 210 mm. (8¼ inches) to thereby provide a fixed gap through which process gasses pass between said susceptor and said baffle ranging about 5.1 mm. (200 mils) to about 7.65 mm. (300 mils); said susceptor having a circular pattern of raised members, on the surface thereof supporting said wafer, defining a circle of slightly greater than 100 mm., whereby said 100 mm. diameter wafer will be inhibited from lateral movement on said susceptor by said raised members; and said susceptor having openings therein beneath said wafer to permit fingers to be inserted therethrough to facilitate raising said wafer from said surface of said susceptor.

26. A CVD process for forming a tungsten silicide layer on semiconductor wafers of various diameters in a deposition chamber comprising:

a) mounting one of said wafers of a given diameter on a first susceptor removably mounted within said chamber and having a fixed outer diameter greater than that of any of the wafers to be processed, said susceptor having a first pattern of raised portions arranged along a circular locus of diameter slightly greater than said first wafer;

b) flowing into a deposition chamber a mixture of gases, including a gaseous source of silicon and a gaseous source of tungsten, through a gas application receptacle having an outer diameter about equal to said fixed outer diameter and defining a pattern of gas outlets to deposit a layer of tungsten silicide on said one wafer;

c) removing said one wafer from said susceptor upon completion of the deposition of said tungsten silicide layer;

d) prior to the mounting of another of said wafers of another diameter than said given diameter, changing to a second susceptor having said fixed outer diameter, and having a second pattern of raised portions arranged along a circular locus of diameter slightly greater than said other water; and e) flowing said gases into said deposition chamber to deposit a layer of tungsten silicide on said other wafer using said gas application receptacle and said predetermined pattern of gas outlets;

whereby a constant gas flow pattern will be maintained in said deposition chamber regardless of wafer diameter being processed to thereby provide uniform deposition conditions in said deposition chamber independent of wafer diameter.

27. The process of claim 26 which further includes the step of, prior to the mounting of yet another of said wafer of yet another diameter, changing to a third susceptor having said fixed outer diameter, and having a third pattern of raised portions arranged along a circular locus of diameter slightly greater than said yet another wafer.

28. The process of claim 26 wherein said step of flowing said gases involves flowing a mixture of gases in which said gaseous source of silicon is dichlorosilane gas.

\* \* \* \* \*